Nov. 23, 1954 K. E. DORIOT ET AL 2,695,338
MEANS FOR REGULATING THE OUTPUT OF ELECTRON TUBE AMPLIFIERS
Filed June 28, 1952
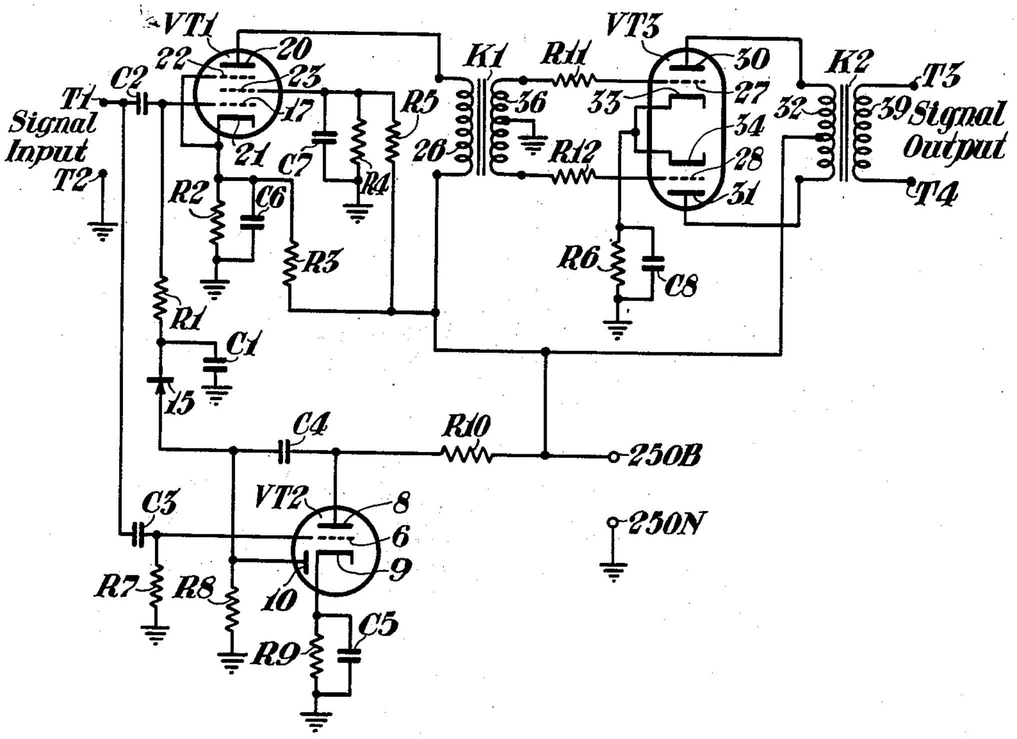
INVENTORS
Kenneth E. Doriot and
George F. McGlumphy
BY W. L. Stout
THEIR ATTORNEY United States Patent Office 2,695,338

Patented Nov. 23, 1954

2,695,338

MEANS FOR REGULATING THE OUTPUT OF ELECTRON TUBE AMPLIFIERS

Kenneth E. Doriot and George F. McGlumphy, Penn Township, Allegheny County, Pa., assignors to Westinghouse Air Brake Company, Wilmerding, Pa., a corporation of Pennsylvania Application June 28, 1952, Serial No. 296,166

1 Claim. (Cl. 179—171)

Our invention relates to means for regulating the output of electron tube amplifiers, and particularly to a low distortion constant amplitude signal wave amplifier means for the input of modulated carrier transmitters.

Because of the obvious desirability of regulating the output of amplifiers, many systems have been designed to accomplish this end. For example, it is desirable to limit the signal wave input of a modulated carrier transmitter to a substantially constant amplitude without introducing distortion of the wave. These regulating systems usually employ either an automatic gain control system or so-called "clipping" circuits. In automatic gain control systems, the gain of the amplifying tube is controlled by a bias control voltage applied to a control grid. In such systems, several cycles of the energy input pass through the amplifier uncontrolled because of the time constant of the direct current bias control circuit. This results in a large, uncontrolled volume of output energy at the beginning of the input signal, which, if the signal input is continued, is quickly attenuated. The number of cycles which pass through the amplifier unlimited may be kept to a minimum by keeping the time constant of the grid bias control circuit low. However, a low time constant of the grid bias control circuit will permit the bias voltage to die away rapidly, and this will result in a fluctuation in the output signal wave of the amplifier if the input signal wave is sporadic, as in speech.

In "clipping" circuits using an electron tube, the tube is usually biased so that it operates around the knee of its saturation curve. This means that the output will rise with the input up to a certain level but beyond that level the output will be relatively constant regardless of the input. Such a system obviously introduces much distortion because of its non-linearity.

One object of our invention is to provide an improved means for regulating and limiting the amplitude of the output wave of an electron tube amplifier without introducing appreciable distortion of the wave.

Another object of our invention is to provide an improved means which will regulate and limit the amplitude of the output wave form of an electron tube amplifier throughout the entire period that an input signal is applied to the amplifier.

According to our invention, the input signal is applied across a voltage divider and a portion of the original input voltage is applied to an amplifier forming part of an automatic gain control system. After being amplified this portion of the signal voltage is rectified. The rectified output is passed through an asymmetric unit and charges a capacitor which is included in a grid bias control circuit of a primary amplifier of the signal wave and which capacitor provides a direct voltage for biasing a control grid of the primary amplifier. The output of the primary amplifier tube is transformer coupled to two amplifiers arranged in push-pull and so biased as to act as a "clipping" circuit. The output of the "clipping" circuit is then coupled by suitable means to whatever device the signal wave is to drive.

In operation, the portion of the input that is impressed on the bias control circuit after being amplified and rectified very rapidly charges the biasing capacitor because the resistance of the asymmetric unit in its forward direction is small. This causes the grid bias of the primary amplifier tube to almost instantaneously reduce the gain thereof. However, a very few cycles of the input wave pass through the primary amplifier unlimited. These few cycles will be limited by the "clipping" circuit. If the input is sporadic, as in speech, each time there is a lapse in the input signal the biasing capacitor will tend to discharge. However, this discharge must take place through the non-pass or reverse direction of the asymmetric unit which has a very large reverse resistance, thus causing the discharge to be slow. Hence the control grid bias voltage of the primary amplifier tube is maintained during short lapses of input.

Other objects of our invention will appear hereinafter as the characteristic features of construction and mode of operation of apparatus embodying our invention are described in detail.

We shall describe one form of regulating means embodying our invention, and shall then point out the novel features thereof in claim.

In the accompanying drawing, there is shown a circuit diagram of regulating and limiting apparatus embodying our invention.

Referring to the drawing, the reference characters T1 and T2 designate a pair of terminals across which a signal wave is at times applied from a supply circuit which is not shown. For example, the supply circuit may be a microphone circuit and the signal wave applied to the terminals T1 and T2 that of the audio frequency current produced by speaking into the microphone. It is to be understood that the invention is not limited to a voice frequency wave, and other signaling waves may be used.

The current applied to the terminals T1 and T2 is impressed upon a main or primary amplifier tube VT1 to be described later, and also upon a gain control circuit means. The input of the gain control circuit includes a voltage divider comprising a capacitor C3 and a resistor R7 in series, this divider being connected across the terminals T1 and T2.

The voltage developed across resistor R7 due to the signaling wave is impressed across a control grid 6 and a cathode 9 of a tube VT2, a biasing unit comprising a resistor R9 and a capacitor C5 in multiple being interposed in the cathode lead. The tube VT2 as here shown is a diode-triode, but other types of tubes can be used and the two tube sections could be in separate envelopes. The tube VT2 and all tubes that will be described hereinafter are provided with circuit means for heating their respective cathodes to enable them to operate in the usual manner. For the sake of clarity, these circuit means have not been included in the drawing nor will they be described herein since they are of usual design and form no part of our invention. The triode section of tube VT2, comprising a plate 8, grid 6 and cathode 9, is provided with plate voltage from the positive terminal 250B of a direct current source of suitable voltage, such as 250 volts, a resistor R10 being included in the connection. The negative terminal 250N of the direct current source is connected to cathode 9 through the usual ground connection and biasing unit R9–C5. Thus the signal voltage developed across resistor R7 and applied to grid 6 is amplified in the usual manner in the plate circuit of the triode section of tube VT2.

The plate circuit of tube VT2 is connected to the diode section of the tube, comprising plate 10 and the cathode 9, through a capacitor C4, and the amplified signal wave in plate circuit of the triode section is rectified and a corresponding unidirectional voltage is created across a load resistor R8 connected to the diode section.

The rectified voltage created across resistor R8 due to the signaling wave applied to tube VT2 is used to charge a capacitor C1, the capacitor C1 being connected across the resistor R8 through an asymmetric unit 15 and ground, the terminal of capacitor C1 connected to ground being the positive terminal. The asymmetric unit 15 may be any one of several known elements having a relatively low resistance in its forward or pass direction and a relatively high resistance in its reverse or non-pass direction. For example, the asymmetric unit 15 may be a copper oxide rectifier element. The asymmetric unit 15 is poled for the rectified current to pass through the unit in its forward or low resistance direction in charging the capacitor C1. Thus, the charging of capacitor C1 is very rapid because of the low time constant of the charging circuit. It should be clear that the direct current voltage created across capacitor C1 is proportional to the magnitude of the input signal wave. As will more fully appear hereinafter, the efficiency of the asymmetric unit for the purpose intended is considerably enhanced by applying thereto a substantially unidirectional pulsating voltage obtained by previous rectification.

When the input signal wave ceases to be applied to terminals T1 and T2, the capacitor C1 commences to discharge, but this discharge is relatively slow because the discharge current must pass through asymmetric unit 15 in its reverse or high resistance direction. Because of this slow discharge, if the input signal wave is reapplied to terminals T1 and T2 rapidly enough, capacitor C1 will still be maintained sufficiently charged to effect the control desired thereof.

The direct current voltage created across the capacitor C1 due to the input signal wave is used as a grid bias voltage for the primary or main amplifier tube VT1, thereby regulating the gain of that tube. Tube VT1 as here shown is a pentode having a plate 20, a cathode 21, a control grid 17 and two additional grids 22 and 23. Of course, other types of tubes could be employed. In tube VT1, the control grid 17 consists of irregularly spaced wires so that as the control grid is driven more negative with respect to the cathode, the tube does not cut off sharply but cuts off gradually along the grid thus giving a slow or remote cut-off tube. For a more detailed description of such a tube reference may be had to Theory and Application of Electron Tubes (section 3–7, second edition), by Herbert J. Reich.

The tube VT1 is biased from the 250 volt direct current source, through a voltage divider comprising resistors R2 and R3 which are connected in series across the power source, a by-pass capacitor C6 being connected across resistor R2. This arrangement renders the bias of tube VT1 substantially independent of fluctuations in the anode current, and essentially results in the gain of the tube being under the full control of the voltage on capacitor C1. The plate 20 of tube VT1 is connected to the high potential end of resistor R3 of the voltage divider, a winding 26 of a coupling transformer K1 being interposed in the plate lead, and the cathode 21 is connected to the junction terminal of resistors R2 and R3. The grid 22 is connected directly to cathode 21 and the grid 23 is provided with positive voltage from the power source through a voltage divider comprising resistors R4 and R5 and is provided with a by-pass capacitor C7 connected across resistor R4. The control grid 17 and cathode 21 of tube VT1 are coupled across the input terminals T1 and T2 through a capacitor C2 and a unit comprising resistor R2 and capacitor C6 in multiple. In this manner the input signal current applied to terminals T1 and T2 is applied to tube VT1 and amplified thereby.

As aforementioned, the tube VT1 is provided with a given fixed bias voltage due to the voltage divider R2—R3 and the parts are so proportioned that tube VT1 operates just ahead of the knee of the grid characteristic curve when no input is received.

The gain of tube VT1 is regulated and controlled by the voltage across capacitor C1, the control grid 17 of tube VT1 being connected to the negative terminal of capacitor C1 through a resistor R1. It follows that the potential of the control grid 17 of tube VT1 is driven negative with respect to cathode 21 by the voltage across capacitor C1 due to amplifying and rectifying a portion of the input signal wave by tube VT2, which negative voltage is proportional to the amplitude of the input signal wave.

As was pointed out earlier, the charge on capacitor C1 varies directly with the input signal wave. Also it is well-known that in amplifying tubes of the remote cut-off variety, the gain of the tube decreases as the control grid bias voltage is driven in the negative direction. Therefore, as the input signal wave increases, the gain of amplifying tube VT1 is decreased and the output wave of the amplifying tube VT1 has substantially a constant amplitude over a relatively wide range in the amplitude of the input signal wave. However, the first few cycles of the input signal wave will not be regulated by the grid bias voltage of tube VT1 due to the small time delay encountered in charging capacitor C1. To limit these few uncontrolled cycles of the input signal wave, the output of the amplifier VT1 is coupled to a "clipping" circuit including two amplifiers arranged in push-pull. A shown, these two amplifiers are sections of a dual triode VT3, but amplifiers having individual envelopes can be used. Specifically, two plates 30 and 31 of tube VT3 are connected to outside terminals of winding 32 of an output transformer K2, a mid-terminal of winding 32 being connected to terminal 250B of the power source. Cathodes 33 and 34 in multiple are connected to negative terminal 250N of the power source through a biasing unit comprising a resistor R6 and a capacitor C8 in multiple.

Control grids 27 and 28 of tube VT3 are connected to outside terminals of a winding 36 of the coupling transformer K1, a mid-terminal of winding 36 being connected to ground. A resistor R11 is interposed into the connection of grid 27 with winding 36 and a resistor R12 is interposed into the connection of grid 28 with winding 36. The parts are so proportioned that each section of tube VT3 operates near the knee of its saturation curve. That is, as the grid of each section is driven more positive, the plate current is not increased proportionally but rises at a slower rate than the grid voltage until finally, regardless of how positive the grid voltage is, the plate current remains substantially constant. The parts are further so proportioned that the tube VT3 will "clip" off any wave whose amplitude is more than 10 per cent greater than the maximum average amplitude of the output of tube VT1. That is, the few initial cycles of the input signal wave which are passed by tube VT1 uncontrolled due to the slight time lag in charging capacitor C1 are substantially suppressed by the peak suppression of tube VT3. Since the number of initial cycles suppressed by tube VT3 is small, distortion of the signal wave of the output tube VT3 is negligible.

The output of tube VT3 is coupled to a pair of output terminals T3 and T4 through the output transformer K2, a secondary winding 39 of the transformer being connected to the terminals T3 and T4. For example, the terminals T3 and T4 may be connected to the input of a modulated carrier transmitter when it is desired to apply to the transmitter a voice frequency wave supplied to the input terminals T1 and T2.

It should be pointed out that because of the excellent characteristics of an automatic gain control system embodying our invention, it is not absolutely necessary to couple the output of tube VT1 to a "clipping" circuit, but instead, the output may be coupled directly to whatever device the signal wave is to drive. However, the "clipping" circuit is desirable to insure against extended lapses of the input signal wave, in which case capacitor C1 would discharge sufficiently so that when the input signal wave was reapplied to input terminals T1 and T2, the first few cycles of input would pass through tube VT1 uncontrolled.

Although we have herein shown and described only one form of means for regulating the output of an amplifier embodying our invention, it will be understood that various changes and modifications may be made therein within the scope of the appended claim without departing from the spirit and scope of our invention.

Having thus described our invention, what we claim is:

In combination, a pair of input terminals adapted to receive a signal wave; a first amplifier tube having at least an anode, control grid, and cathode, said control grid being coupled to one of said input terminals; a cathode resistor, said cathode being connected by way of said cathode resistor to the other of said input terminals: connections for supplying an anode potential to said first tube; a second resistor connecting said cathode to one of said connections to provide a steady component of bias for said first tube; a bias control means including a second amplifier tube having input and output electrodes and a rectifier section, a third resistor, an asymmetric unit having a small forward direction resistance and a large reverse direction resistance, and a capacitor; said second amplifier tube having its input electrodes coupled to said input terminals and its output electrodes connected across said rectifier section through said third resistor to provide a rectified voltage across said third resistor in proportion to the signal wave supplied to said input terminals, said capacitor being connected across said third resistor through said asymmetric unit with the unit so poled that said capacitor is charged by said rectified voltage through the forward resistance of said asymmetric unit; means connecting said capacitor to the control grid of said first amplifier tube to control the gain of said first tube by the charge of the capacitor, and output circuit means coupled to the anode and cathode of said first amplifier tube.

(References on following page)

References Cited in the file of this patent

UNITED STATES PATENTS

| Number | Name | Date |
|---|---|---|
| 1,869,331 | Ballantine | July 26, 1932 |
| 1,959,062 | Place | May 15, 1934 |
| 2,029,354 | Bossart | Feb. 4, 1936 |
| 2,077,139 | Bartels et al. | Apr. 13, 1937 |
| 2,138,891 | Soller | Dec. 6, 1938 |

OTHER REFERENCES

Terman text, "Radio Engineering," 3d ed., p. 738, pub. 1947 by McGraw-Hill Book Co., N. Y. (Copy in Div. 69.)